(12) United States Patent
Steiger et al.

(10) Patent No.: US 8,502,543 B2
(45) Date of Patent: Aug. 6, 2013

(54) TEST CONFIGURATION FOR THE IMPULSE VOLTAGE TEST OF ELECTRIC HIGH-VOLTAGE COMPONENTS

(75) Inventors: Matthias Steiger, Schierau (DE); Peter Werle, Walsrode (DE)

(73) Assignee: ABB Technology AG, Zürich (CH)

( * ) Notice: Subject to any disclaimer, the term of this patent is extended or adjusted under 35 U.S.C. 154(b) by 247 days.

(21) Appl. No.: 12/961,094

(22) Filed: Dec. 6, 2010

(65) Prior Publication Data
US 2011/0109319 A1    May 12, 2011

Related U.S. Application Data

(63) Continuation of application No. PCT/EP2009/004048, filed on Jun. 5, 2009.

(30) Foreign Application Priority Data

Jun. 12, 2008 (EP) .................................. 08010755

(51) Int. Cl.
*G01R 31/02* (2006.01)
*G01R 31/28* (2006.01)

(52) U.S. Cl.
CPC ................... *G01R 31/2805* (2013.01)
USPC .......................................... 324/537

(58) Field of Classification Search
None
See application file for complete search history.

(56) References Cited

U.S. PATENT DOCUMENTS

| | | | |
|---|---|---|---|
| 2,032,904 A * | 3/1936 | Bellaschi | 324/551 |
| 2,237,812 A | 4/1941 | De Blieux | |
| 2,551,841 A | 5/1951 | Kepple et al. | |
| 2,905,891 A * | 9/1959 | Duenke et al. | 324/547 |
| 4,367,512 A | 1/1983 | Fujita | |
| 4,427,898 A | 1/1984 | Miyake et al. | |
| 4,535,253 A | 8/1985 | Ootsuka et al. | |
| 4,829,256 A * | 5/1989 | Yamagiwa et al. | 324/557 |
| 5,845,854 A * | 12/1998 | Adam et al. | 241/1 |
| 6,211,683 B1 | 4/2001 | Wolf | |
| 6,586,697 B1 | 7/2003 | Enns | |
| 7,394,171 B2 * | 7/2008 | Loppacher | 307/106 |

FOREIGN PATENT DOCUMENTS

| | | |
|---|---|---|
| AT | 330 887 | 7/1976 |
| AT | 330 887 B | 7/1976 |
| DE | 521 475 C | 3/1931 |
| DE | 1 563 442 | 4/1970 |

(Continued)

OTHER PUBLICATIONS

International Search Report (PCT/ISA/210) issued on Nov. 9, 2009, by European Patent Office as the International Searching Authority for International Application No. PCT/EP2009/004048.

(Continued)

*Primary Examiner* — Paresh Patel
(74) *Attorney, Agent, or Firm* — Buchanan Ingersoll & Rooney PC

(57) ABSTRACT

The embodiments relate to a test configuration for an impulse voltage test of electric high-voltage components with a lightning generator. The lightning generator can be moved between a first horizontal position within a cuboid container, and a vertical position relative to the container. A movement between the two positions includes a pivoting movement about a rotational axis. The proofing movement is transverse to the longitudinal direction of the lightning generator. The container can be closed at the top by at least one moveable cover.

11 Claims, 2 Drawing Sheets

FOREIGN PATENT DOCUMENTS

| | | |
|---|---|---|
| DE | 23 28 375 A1 | 1/1975 |
| DE | 196 39 023 A1 | 3/1998 |
| DE | 200 01 837 U1 * | 5/2009 |
| EP | 2 133 704 A1 | 12/2009 |
| JP | 61102176 A * | 5/1986 |
| SU | 1179234 A * | 9/1985 |
| WO | WO 2009/149866 A1 | 12/2009 |

OTHER PUBLICATIONS

International Search Report (PCT/ISA/210) issued on Nov. 3, 2009, by European Patent Office as the International Searching Authority for International Application No. PCT/EP/2009/003756.

European Search Report issued on Nov. 26, 2008 (with English translation of category of cited documents) for Application No. 08010691.

International Search Report (PCT/ISA/210) issued on Nov. 3, 2009, by European Patent Office as the International Searching Authority for International Application No. PCT/EP/2009/003977.

International Search Report (PCT/ISA/210) issued on Oct. 23, 2009, by European Patent Office as the International Searching Authority for International Application No. PCT/EP/2009/004001.

International Search Report (PCT/ISA/210) issued on Nov. 9, 2009, by European Patent Office as the International Searching Authority for International Application No. PCT/EP2009/003976.

A. Winter et al., "A Mobile Transformer Test System Based on a Static Frequency Converter", XVth International Symposium on High Voltage Engineering, Ljubljana, Slovenia, Aug. 27-31, 2007; T10-732; pp. 1-6, XP-002500564.

W. Schufft et al., "Frequency-Tuned Resonant Test Systems for On-Site Testing and Diagnostics of Extruded Cables", High Voltage Engineering Symposium, Aug. 22-27, 1999, vol. 5, No. 467, pp. 335-339, London, UK, XP-006501811.

Alexander Winter et al., "A New Generation of On-Site Test Systems for Power Transformers", IEEE International Symposium on Electrical Insulation, Jun. 9-12, 2008, pp. 478-482, Vancouver, Canada, XP-007906016.

S. Schierig et al., "HV AC Generation Based on Resonant Circuits With Variable Frequency for Testing of Electrical Power Equipment on Site", International Conference on Condition Monitoring and Diagnosis, Beijing, China, Apr. 21-24, 2008, pp. 684-691, Piscataway, U.S., XP-031292593.

T. Grun et al., "Equipment for On-Site Testing of HV Insulation", High Voltage Engineering Symposium, Aug. 22-27, 1999, pp. 240-243, London, UK, XP-006501801.

J. Lopez-Roldan et al., "Mobile Substations: Application, Engineering and Structural Dynamics", IEEE, Jan. 1, 2006, pp. 951-956, Piscataway, NJ, XP-031101946.

Jose Lopez-Roldan et al., "How to Achieve a Rapid Deployment of Mobile Substations and to Guarantee Its Integrity During Transport", IEEE Transactions on Power Delivery, vol. 23, No. 1, Jan. 2008, pp. 196-202, New York, New York, US, XP-011197613.

High Volt: "Tuneable Modular Reactors of High Power, Types DERI . . . M, G", Data Sheet No. 1.22/4, Apr. 1, 2007, pp. 1-3.

Haefely High Voltage Test, "Impulse Voltage Test System SGSA", 2001, pp. 1-18, XP-0091090930.

Klaus Schwenk et al., "Load Range Extension Methods for Lightning Impulse Testing With High Voltage Impulse Generators", 6 pages.

M. Loppacker, "On-Site Impulse Tests and Corresponding State of the Art Measurement and Analysis Techniques for Power Transformers", Haefely High Voltage Test, 1999, 5 pages.

Office Action issued on Dec. 28, 2012 by the USPTO in corresponding U.S. Appl. No. 12/963,144.

Eklund et al., "Transformation vor Ort", ABB Technik Apr. 2007, pp. 45-48.

Eklund et al., "Increase transformer reliability and availability: From condition assessment to On-Site Repair", Power-Gen Middle East, Bahrain, 2007, pp. 1-17.

Data Sheet No. 1.22/2, "Tunable Modular, Reactors of High Power, Types DERI . . . M, G", High Volt, XP007910187.

Küchler, Prof. Dr.-Ing. Andreas, "Hochspannungstechnik", Springer, Verlag Bern Heidelberg 2005, p. 444.

Dissertation of Dipl-Ing. Florian Martin, "Hochspannungsprüfsystem auf Basis leistungselektronischer Frequenzkonverter", May 20, 2008, pp. 1-188.

Presentation for "Mobile on-site test system for off-line tests and diagnostics at power transformers", ABB, 2006, pp. 1-17.

Notice of Opposition filed in corresponding European Patent Application No. 2286254 on May 23, 2012.

Notice of Opposition filed in corresponding European Patent Application No. 2133888 on May 9, 2012.

Office Action issued by the U.S. Patent and Trademark Office in the U.S. Appl. No. 12/963,941, mailed Jun. 20, 2013, U.S. Patent and Trademark Office, Alexandria, VA. (10 pages).

Office Action issued by the U.S. Patent and Trademark Office in the U.S. Appl. No. 12/963,144, mailed Jun. 21, 2013, U.S. Patent and Trademark Office, Alexandria, VA. (15 pages).

* cited by examiner

TEST CONFIGURATION FOR THE IMPULSE VOLTAGE TEST OF ELECTRIC HIGH-VOLTAGE COMPONENTS

RELATED APPLICATIONS

This application claims priority as a continuation application under 35 U.S.C. §120 to PCT/EP2009/004048, which was filed as an International Application on Jun. 5, 2009, designating the U.S., and which claims priority to European Patent Application No. 08010755.0 filed in Europe on Jun. 12, 2008. The entire contents of these applications are hereby incorporated by reference in their entireties.

FIELD

The present disclosure relates to impulse voltage generators, such as a test arrangement for impulse voltage testing of electrical high-voltage components by an impulse voltage.

BACKGROUND INFORMATION

Impulse voltage generators can be used to test high-voltage components, such as power transformers. An impulse voltage generator can produce a voltage pulse which is supplied by suitable electrical circuitry from the impulse voltage generator to a component, such as a high voltage winding of the unit under test that is to be tested. A voltage pulse normally has a time duration in a range up to several tens of microseconds, and the maximum voltage—depending on the unit under test—is up to several mega volts (MV). Conclusions about the state of the tested component can be derived from a continuous measurement of current and/or voltage values within the electrical circuitry of the test layout when under the influence of the voltage pulse. For example, the age or a fault in the electrical insulation can be determined from the current and/or voltage measurements.

An impulse voltage generator has multiple capacitors which can be charged and connected in parallel to produce a high-voltage pulse. The capacitors can then be discharged, and electrically connected in series. Higher voltages can be achieved by the series connection. The impulse voltage generator can include a tower-like structure having a capacitor, a resistor, a spark gap, and insulators that are arranged in a grid structure. The insulators can be in the form of tubes composed of an insulation material, such as GRP (glass reinforced plastic) for example. The insulators can be arranged one behind the other along the tower-like structure, in a plurality of supporting columns which extend over the entire length of the structure. The electrical components can be arranged transversely with respect to the insulators. Impulse voltage generators should be operated only in the vertical, upright state, to maintain the necessary isolation separations from the adjacent ground potential. The highest voltage occurs at the tip of the impulse voltage generator.

High-voltage components such as power transformers can be very heavy, such as on the order of several hundred tons, depending on the electrical rating. Transportation of a power transformer stored within an electrical power distribution system to a fixed-installed test field, so that the transformer can be tested using an impulse voltage test for maintenance or for diagnostic purposes, is virtually impossible because of the high transportation cost. Furthermore, it is extremely rare for sufficient redundancy to be available in a power distribution network to allow a transformer to be removed without adversely affecting network operation.

For this reason, impulse voltage tests on power transformers are generally carried out in an original location without transporting. The test arrangement with the impulse voltage generator and further components required for the test, such as voltage dividers, measurement apparatuses and evaluation apparatuses, are transported in a plurality of assemblies to the testing or servicing location, and are assembled there to form a test arrangement. The voltage divider can be used to measure high voltages up to 2 MV, for example, as desired. The voltage divider can be of considerable size, such as at a height of 10 m, for example, in addition to the impulse voltage generator.

In some test circuit configurations for impulse voltage tests, a surge arrester can be provided. The surge arrester can cut off the impulse voltage when the rising impulse voltage pulse exceeds a specified threshold magnitude. Surge arresters can be installed in the respective test arrangement as separate components, and can be arranged as a column and at a considerable height.

The foregoing test circuits as described, are assembled on site which involves a considerable amount of time. In particular, the positioning and assembly of an impulse voltage generator, a surge arrester or a voltage divider can be time-consuming.

SUMMARY

An exemplary embodiment is directed to a test arrangement for impulse voltage testing of electrical high-voltage components. The test arrangement includes a cuboid container having a first and a second container ends and at least one movable cover on an upper face. The test arrangement also includes an impulse voltage generator in the form of a tower-like structure, wherein the impulse voltage generator is movable between a first substantially horizontal position within the cuboid container, and a substantially vertical position relative to the container. A respective movement between the vertical and horizontal positions includes a transverse pivoting movement about a rotation axis with respect to a longitudinal direction of the impulse voltage generator. Moreover, the container is closable on its upper face by the at least one movable cover.

BRIEF DESCRIPTION OF THE DRAWINGS

The disclosure, further embodiments and further advantages will be described in more detail with reference to exemplary embodiments, which are illustrated in the drawings, in which.

DETAILED DESCRIPTION

Figure 1:
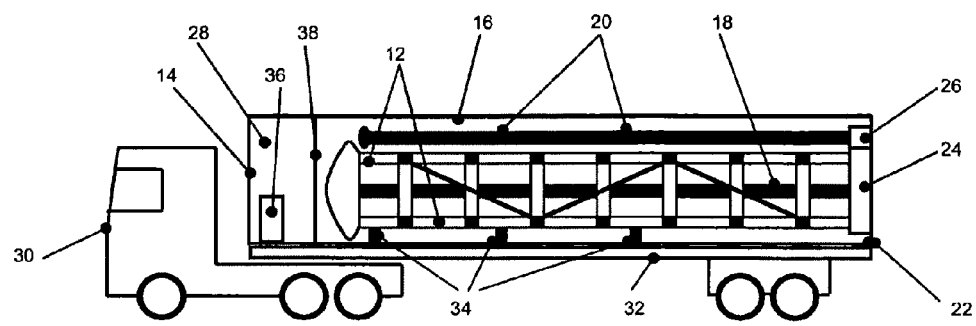
FIG. 1 illustrates a test arrangement with a horizontal impulse voltage generator, in accordance with an exemplary embodiment.

The present disclosure is related to a test arrangement for impulse voltage testing of electrical high-voltage components, which reduces the time required for on-site assembly.

According to the present disclosure, the test arrangement includes an impulse voltage generator that is movable between a first substantially horizontal position and a substantially vertical position within a cuboid container. The cuboid container has a first and a second container end. The impulse voltage generator can be in a substantially vertical position relative to the container, in that a respective movement between the horizontal and vertical positions includes a transverse pivoting movement about a respective rotation axis in a longitudinal direction of the impulse voltage generator. The container is closable on its upper face by at least one movable cover.

The entire test arrangement can be arranged and transported within a single container. The impulse voltage generator can be transported in a horizontal position, as desired so that all the major components of the test arrangement are located within the boundary of the container.

Separations can be established during operation to isolate the impulse voltage generator and grounded components.

Separations can be established to by the pivoting movement of the impulse voltage generator to a vertical position. The pivoting movement can be executed after placing the container in the immediate vicinity of the high-voltage component to be tested, for example at a distance of 5 m to 30 m.

Based on the above configuration a complete test arrangement for impulse voltage testing can be transported in an advantageous manner, and operated with little effort.

In a further exemplary embodiment of the test arrangement, at least one surge arrester can be pivoted together with the high-voltage generator between a substantially horizontal position within the container and a substantially vertical position. Surge arresters can have an elongated structure of considerable size, as desired, which can make it more difficult to construct the test arrangement on site. A joint pivoting movement together with the impulse voltage generator allows the same advantages as those described above for the impulse voltage generator.

In one variant of the exemplary test arrangement according to the present disclosure, the surge arrester has one spark gap or a plurality of spark gaps connected in series, as desired. The spark gaps can be designed so that a flashover takes place when a threshold voltage is exceeded on one side of the voltage divider, with the other side of the voltage divider being grounded as desired. The impulse voltage pulse is therefore shorted above a specific voltage level. Electrical resistors can be connected in series with the spark gaps as desired, in order to limit the short-circuit current. The series circuit formed by a plurality of spark gaps and resistors results in a surge arrester having an elongated structure, such as along the order of a plurality of meters as desired.

In a further exemplary embodiment of the test arrangement according to the present disclosure, the surge arrester can have at least one semiconductor element, which likewise limits the electrical voltage present along its two connections. In this arrangement, a plurality of elements are connected in series. The plural elements can also include electrical resistors, which results in an elongated structure for a surge arrester. A spark gap can also be established in this exemplary arrangement as desired.

In one exemplary test arrangement according to the present disclosure, the surge arrester can be arranged in the interior of the structure, of the impulse voltage generator. In this arrangement, the impulse voltage generator can be a structure, such as a tower or similar structure as desired. The elongated structure of the surge arrester, which can be a column, can be integrated into an inner unused area or similar structure as desired, of the impulse voltage generator. This arrangement can be achieved by the impulse voltage generator having three or four insulator columns which extend over its entire height. The electrical components of the impulse voltage generator can thus be arranged like struts between the columns, as a result of which the internal area bounded by them can be unused.

It is therefore possible to integrate a space-consuming component such as a surge arrester in the unused space. In order to ensure the maximum separations between adjacent components of the impulse voltage generator, the surge arrester can be arranged in the center region of the base area in the structure of the impulse voltage generator as desired. Given this arrangement, no additional pivoting apparatus is required because the pivoting apparatus of the impulse voltage generator can be used.

In a further exemplary test arrangement of the present disclosure, the surge arrester can be integrated into the structure of the impulse voltage generator. In this arrangement, the impulse voltage generator can be a structure, such as a tower or similar structure as desired. The individual electrical components of the voltage generator can be connected in series. The electrical components can include a resistor, a spark gap, and/or a semiconductor element. These components can be integrated into the tower structure as struts between the insulator columns, or individual components can be integrated into one or more respective insulator columns is the insulator column elements can be hollow-cylindrical structures, which prior to the exemplary test arrangements served as unused space.

The electrical series circuit formed by the individual components of a surge arrester can be arranged along the entire extent of the impulse voltage generator as desired. For example, the individual components can be arranged between first and second ends of the structure. This arrangement reduces the risk of an electrical flashover between components of the impulse voltage generator and the individual components of the surge arrester, which is integrated therein, because the electrical potential differences between them are lower.

In a similar manner, an exemplary test arrangement is also provided in which a surge arrester—which can be in a column form—can be arranged in an outer area of the impulse voltage generator, and aligned parallel to it. As a result of this arrangement, when the surge arrester and the impulse voltage generator are connected to one another by a variable-length movement apparatus which acts transversely with respect to their parallel longitudinal axes, they can be transported horizontally and in a space-saving manner. Moreover, the surge arrester and the impulse voltage generator can be moved axially apart from one another after they have been erected in a vertical position. Thus, this arrangement achieves a minimum separation for test operation which is advantageous for isolation of the components.

Another exemplary test arrangement according to the present disclosure includes a voltage divider that is pivotable together with the impulse voltage generator between a substantially horizontal position within the container and a substantially vertical position.

The voltage divider can be a column-like, elongated, and electrical component. The voltage divider and the impulse voltage generator can be connected to one another by a variable length movement apparatus which acts transversely with respect to their parallel longitudinal axes. The voltage divider and the surge arrester can be moved by separate linear movement apparatuses. The movements can be directed axially and away from the impulse voltage generator, after they have been jointly erected.

In a further exemplary test arrangement of the present disclosure, the container can be a transportable standard freight container which is bounded at least partially by walls or wall segments on each of its six sides. The standard freight container can be a 40-foot container or similar structure as desired.

A freight container with a size of 40 feet is suitable for being transported by conventional transport means, for example by ship, railroad, or goods vehicle. The 40 foot length corresponds to a greatest available length of a standard freight container, and is not significantly greater than a length of about 10 m, which accommodates an impulse voltage generator and voltage divider. Test arrangements with impulse voltage generators and voltage dividers of shorter lengths can correspondingly also be arranged in shorter standard freight containers.

In one exemplary test arrangement of the present disclosure, the standard freight container can be licensed in accordance with the CSC (Container Safety Convention). This means, for example, that the standard freight container can be arranged in any desired stacking position when loaded onto a container ship, which makes it considerably easier to transport the test arrangement.

FIG. 1 shows a test arrangement 10 with a horizontal impulse voltage generator in accordance with an exemplary embodiment. The impulse voltage generator 12 is arranged in the horizontal position in a cuboid container 14, such as a CSC-licensed 40-foot standard freight container located on a goods-vehicle semi-trailer 32. The impulse voltage generator 12 can have four supporting columns that include a plurality of insulator elements. The columns can be composed of ceramic and can include a tower-like structure with cross-struts. The cross-struts can be formed from electrical components, such as resistors, of the impulse voltage generator 12 on a right-hand end. The impulse voltage generator, which rests on supporting elements 34 in this position, can be mounted on a base element 24 that is adjacent to an end surface of the container 14. A voltage divider 20 can be arranged in a horizontal position, parallel to the longitudinal axis of the impulse voltage generator 12. The voltage divider 20 can be mounted on a base element 26 which is connected to the base element 24 of the impulse voltage generator 12 via a linear movement apparatus (not shown). A control electrode can be indicated on the other side of the high-voltage generator 12.

The base element 24 can be pivotable about the rotation axis 22. As a result, of the impulse voltage generator and the supporting columns, which are rigidly connected to it, are pivotable to a vertical position. A surge arrester 18 is shown centrally in the inner area of the impulse voltage generator 12. The surge arrester 18 can include a series circuit having a spark gap with a plurality of semiconductor elements and resistors. These semiconductor elements and resistors are arranged in a column-like structure which is located, at the center thereof, along the length of the impulse voltage generator.

In an upper roof area, the standard freight container 14 is bounded by a cover 16 which can be opened and closed. A measurement area 28 is provided in the right-hand area of the container 14, and is separated by a separating wall 38. The measurement area 28 can include a measurement apparatus 36 which, in this example, is in fact indicated only schematically.

Figure 2:
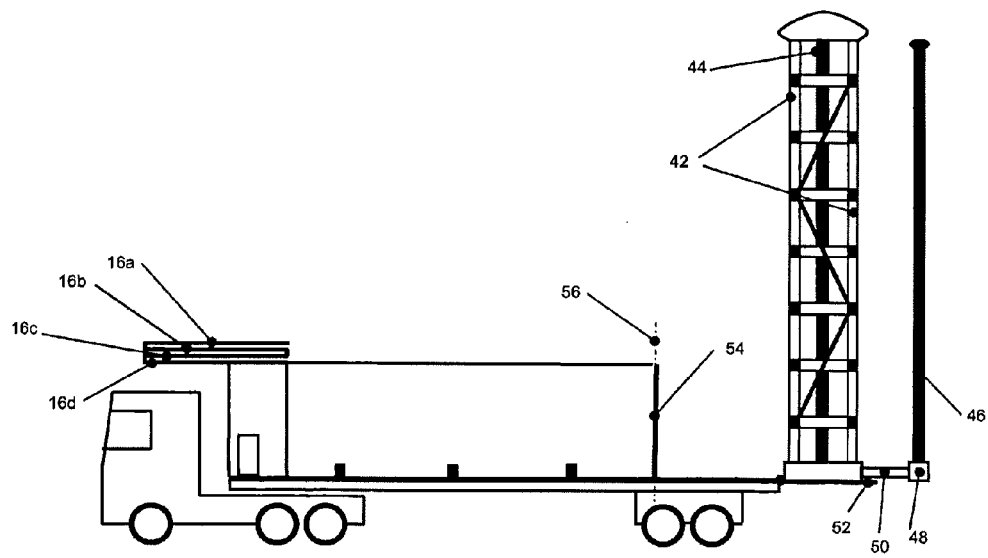
FIG. 2 illustrates the test arrangement with a vertical impulse voltage generator in accordance with an exemplary embodiment.

FIG. 2 illustrates a test arrangement with a vertical impulse voltage generator in accordance with an exemplary embodiment. The surge arrester can be arranged rigidly with respect to the impulse voltage generator. The impulse voltage generator and the voltage divider 46 are shown in the vertical position 44. The base elements of the impulse voltage generator 42 and of the voltage divider 46 can be moved apart from one another by a variable-length movement apparatus 50 so that the axial separation between the voltage divider 46 and the impulse voltage generator 42 is large enough to ensure test operation at high voltage without flashovers.

The side wall 54 of the container can be folded outward about a folding axis 56 in a rear area of the container. The segments 16a, b, c, d, which form the container roof, can be folded together horizontally as shown, so that the segments can be stacked vertically above the roof of a vehicle in a front area of the standard freight container. This arrangement allows the impulse voltage generator to be pivoted out of the container.

Figure 3:
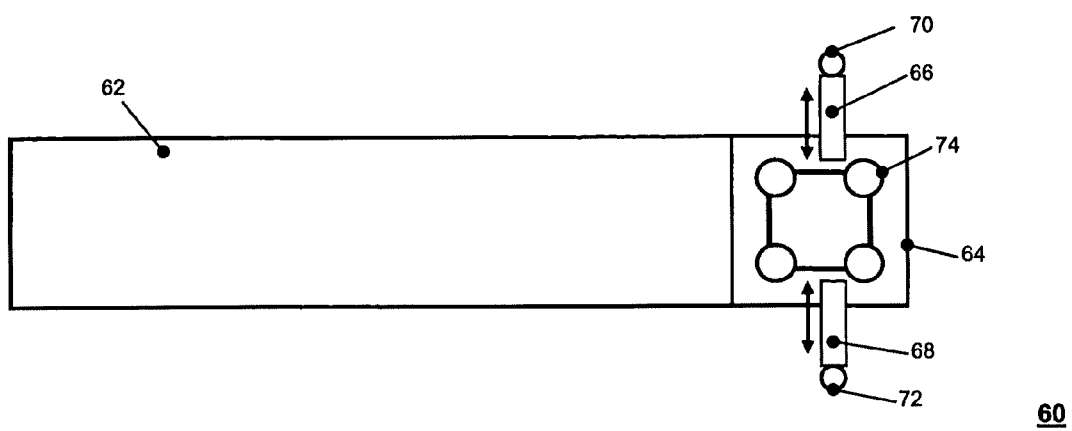
FIG. 3 illustrates a plan view of a second test arrangement in accordance with an exemplary embodiment.

FIG. 3 illustrates a plan view of a second test arrangement 60 in accordance with an exemplary embodiment. The second test arrangement 60 includes a second impulse voltage generator 74, a second surge arrester 72 and a second voltage divider 70. A right-hand end wall 64 of a second cuboid container 62 is pivoted to a horizontal position. The second impulse voltage generator 74, is arranged at right angles to the right-hand end wall 64, the second surge arrester 72 and the voltage divider 70 can be pivoted out of the container 62 to a vertical position as shown, as a result of which only the outlines of said components are indicated. The second voltage divider 70 and the second surge arrester 72 can be moved axially away from the impulse voltage generator 74 by a respective linear movement apparatus 66, 68, thus creating an adequate isolation separation between these components.

Other movement apparatuses 66, 68 can be used as desired to carry out a pivoting movement, such as varying the distance from the impulse voltage generator 74.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A test arrangement for impulse voltage testing of electrical high-voltage components comprising:
    a cuboid container having a first and a second container end and at least one movable cover on an upper face; and
    an impulse voltage generator that is a tower-like structure,
    wherein the impulse voltage generator is movable between a substantially horizontal position within the cuboid container, and a substantially vertical position relative to the container,
    wherein a respective movement between the vertical and horizontal positions includes a transverse pivoting movement about a rotation axis with respect to a longitudinal direction of the impulse voltage generator, and
    wherein the container is closable on its upper face by the at least one movable cover.

2. The test arrangement as claimed in claim 1, comprising:
    at least one surge arrestor,
    wherein the at least one surge arrester can be pivoted together with the high-voltage generator between a substantially horizontal position within the container and a substantially vertical position.

3. The test arrangement as claimed in claim 2, wherein the surge arrester has at least one spark gap.

4. The test arrangement as claimed in claim 2, wherein the surge arrester has at least one semiconductor element.

5. The test arrangement as claimed in claim 2, wherein the surge arrester is arranged in the interior of the structure of the impulse voltage generator.

6. The test arrangement as claimed in claim 2, wherein the surge arrester is integrated in the tower-like structure of the impulse voltage generator.

7. The test arrangement as claimed in claim 2, wherein the surge arrester is arranged outside the tower-like structure, of the impulse voltage generator and is aligned parallel to it.

8. The test arrangement as claimed in claim 7, wherein the surge arrester and the impulse voltage generator are connected through a variable-length movement apparatus which acts transversely with respect to their parallel longitudinal axes.

9. The test arrangement as claimed in claim 1, wherein a voltage divider is pivotable together with the impulse voltage generator between a substantially horizontal position within the container and a substantially vertical position.

10. The test arrangement as claimed in claim 9, wherein the voltage divider and the impulse voltage generator are connected through a variable-length movement apparatus which acts transversely with respect to respective parallel longitudinal axes of the voltage divider and the impulse generator.

11. The test arrangement as claimed in claim 1, wherein the container is a standard freight container.

* * * * *